(12) United States Patent
Lee

(10) Patent No.: US 8,435,810 B2
(45) Date of Patent: May 7, 2013

(54) METHOD OF MANUFACTURING ORGANIC LIGHT EMITTING DISPLAY DEVICE

(75) Inventor: Joo-Hyeon Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 261 days.

(21) Appl. No.: 12/929,911

(22) Filed: Feb. 24, 2011

(65) Prior Publication Data

US 2011/0207254 A1    Aug. 25, 2011

(30) Foreign Application Priority Data

Feb. 25, 2010 (KR) .......................... 10-2010-0017196

(51) Int. Cl.
*H01L 21/84* (2006.01)
(52) U.S. Cl.
USPC ............... 438/29; 438/151; 257/E21.561
(58) Field of Classification Search .............. 438/29–30, 438/151–166; 257/E21.561
See application file for complete search history.

(56) References Cited

U.S. PATENT DOCUMENTS

| | | | |
|---|---|---|---|
| 5,478,658 A | 12/1995 | Dodabalapur et al. | |
| 5,682,402 A | 10/1997 | Nakayama et al. | |
| 5,981,972 A * | 11/1999 | Kawai et al. | 257/59 |
| 7,674,712 B2 * | 3/2010 | Cok | 438/675 |
| 2006/0097264 A1 | 5/2006 | Kim et al. | |
| 2006/0105492 A1 | 5/2006 | Veres et al. | |
| 2008/0036361 A1 | 2/2008 | Tsai et al. | |
| 2011/0012816 A1 | 1/2011 | Kang et al. | |

FOREIGN PATENT DOCUMENTS

| | | |
|---|---|---|
| JP | 07-320864 A | 12/1995 |
| JP | 08-250786 A | 9/1996 |
| JP | 2005-183782 A | 7/2005 |
| JP | 2008-112112 A | 5/2008 |
| KR | 10 2005-0032114 A | 4/2005 |
| KR | 10 2006-0042728 A | 2/2007 |
| KR | 10 2008-0013826 A | 2/2008 |
| KR | 10 2008-0041939 A | 5/2008 |
| KR | 10 2011-0008621 A | 1/2011 |

OTHER PUBLICATIONS

Korean Notice of Allowance in KR 10-2010-0017196, dated Nov. 30, 2011 (Lee).

* cited by examiner

*Primary Examiner* — Richard A. Booth
(74) *Attorney, Agent, or Firm* — Lee & Morse, P.C.

(57) ABSTRACT

A method of manufacturing an organic light emitting display device includes providing a panel including a first opening portion formed in a first substrate and a second opening portion spaced apart from the first opening portion, disposing a transmissive-window forming composition in the second opening portion, forming an organic layer in the first opening portion, forming a metal layer on the panel so as to cover the first opening portion and the second opening portion, and forming a transmissive window by volatilizing the transmissive-window forming composition to open a region of the metal layer corresponding to the second opening portion.

32 Claims, 14 Drawing Sheets

METHOD OF MANUFACTURING ORGANIC LIGHT EMITTING DISPLAY DEVICE

BACKGROUND

1. Field

Embodiments relate to an organic light emitting display device and a method of manufacturing an organic light emitting display device.

2. Description of the Related Art

Applications of organic light emitting display devices range from personal portable devices such as MP3 players and mobile phones to television sets, due to their having superior characteristics such as wide viewing angles, high contrast ratios, short response times, and low amounts of power consumption.

An organic light emitting display device has self-light emitting characteristics, and weight and thickness of the organic light emitting display device can be reduced since the organic light emitting display device does not require an additional light source, unlike a liquid crystal display device.

Also, an organic light emitting display device can be formed as a transparent display device by having transparent thin film transistors (TFTs) and transparent organic light emitting devices.

SUMMARY

It is a feature of an embodiment to provide a method of manufacturing an organic light emitting display device in which a transmissive region is formed without using a fine metal mask (FMM).

At least one of the above and other features and advantages may be realized by providing a method of manufacturing an organic light emitting display device, the method including providing a panel including a first opening portion formed in a first substrate and a second opening portion spaced apart from the first opening portion, disposing a transmissive-window forming composition in the second opening portion, forming an organic layer in the first opening portion, forming a metal layer on the panel so as to cover the first opening portion and the second opening portion, and forming a transmissive window by volatilizing the transmissive-window forming composition to open a region of the metal layer corresponding to the second opening portion.

The transmissive-window forming composition may include a first solvent that is in a solid state at a temperature of about 10 to about 30° C., and a second solvent that is in a liquid state at a temperature of about 10 to about 30° C.

A melting point of the first solvent may be about 30 to about 200° C.

A boiling point of the first solvent may be about 200 to about 500° C.

A boiling point of the second solvent may be about 100 to about 200° C.

An amount of the first solvent in the transmissive-window forming composition may be about 10 to about 150 parts by weight based on 100 parts by weight of the second solvent.

An amount of the first solvent in the transmissive-window forming composition may be about 20 to about 40 parts by weight based on 100 parts by weight of the second solvent.

The first solvent may include at least one of bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, decafluorobiphenyl, 1,4-di-tert-butylbenzene, 2,6-di-tert-butyl-4-ethylphenol, 2,6-di-tert-butylphenol, 2,4-di-tert-butylphenol, 2,5-dichloroaniline, and 3,5-dichlorocatechol.

The second solvent may include at least one of tetrahydrofuran, chloroform, N,N-dimethylformamide, 4-methylheptane, 1,4-dioxane, 1-propanol, cyclohexanone, decane, propylene carbonate, nonane, 4-methyl anisole, toluene, tetralin, diphenylether, 1,3-dichlorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

The transmissive-window forming composition may be disposed in the second opening portion so that a central portion of the transmissive-window forming composition has a convex shape in an upward direction.

The transmissive-window forming composition may be disposed in the second opening portion by using a nozzle printing method or an inkjet printing method.

The method may further include, between the disposing of the transmissive-window forming composition and the forming of the metal layer, volatilizing the second solvent.

The forming of the transmissive window may include liquefying the first solvent by heating the first solvent, vaporizing the first solvent from a liquid state, forming the transmissive window by increasing a vapor pressure of the first solvent vaporized in the second opening to open a region of the metal layer, corresponding to the second opening portion, and emitting the first solvent to outside through opened region of the metal layer.

The liquefying of the first solvent may be performed by heating the first solvent to a temperature of about 30 to about 80° C.

The vaporizing of the first solvent may be performed by heating the first solvent to a temperature of about 80 to about 200° C.

The emitting of the first solvent may include heating the panel while the first solvent is removed from the second opening portion.

The panel may include a thin film transistor (TFT) formed on the first substrate, a passivation layer formed to cover the TFT, a pixel electrode formed on the passivation layer and connected to the TFT, and a pixel definition layer formed on the passivation layer, the pixel definition layer including the first opening portion for exposing the pixel electrode therethrough, and the second opening spaced apart from the first opening portion.

At least one of the above and other features and advantages may also be realized by providing a method of manufacturing an organic light emitting display device, the method including providing a panel including a first opening portion formed in a first substrate and a second opening portion spaced apart from the first opening portion, disposing a transmissive-window forming composition in the second opening portion, disposing a barrier rib on the transmissive-window forming composition, forming an organic layer in the first opening portion, forming a metal layer on the panel so as to cover the organic layer and the barrier rib, laminating a laminating film on the metal layer, liquefying the transmissive-window forming composition, and removing the barrier rib and the transmissive-window forming composition from the second opening portion by delaminating the lamination film.

The transmissive-window forming composition may include a first solvent that is in a solid state at a temperature of about 10 to about 30° C., and a second solvent that is in a liquid state at a temperature of about 10 to about 30° C.

A melting point of the first solvent may be about 30 to about 200° C.

A boiling point of the first solvent may be about 200 to about 500° C.

A boiling point of the second solvent may be about 100 to about 200° C.

An amount of the first solvent in the transmissive-window forming composition may be about 10 to about 150 parts by weight based on 100 parts by weight of the second solvent.

An amount of the first solvent in the transmissive-window forming composition may be about 20 to about 40 parts by weight based on 100 parts by weight of the second solvent.

The first solvent may include at least one of bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, decafluorobiphenyl, 1,4-di-tert-butylbenzene, 2,6-di-tert-butyl-4-ethylphenol, 2,6-di-tert-butylphenol, 2,4-di-tert-butylphenol, 2,5-dichloroaniline, and 3,5-dichlorocatechol.

The second solvent may include at least one of tetrahydrofuran, chloroform, N,N-dimethylformamide, 4-methylheptane, 1,4-dioxane, 1-propanol, cyclohexanone, decane, propylene carbonate, nonane, 4-methyl anisole, toluene, tetralin, diphenylether, 1,3-dichlorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

The transmissive-window forming composition may be disposed in the second opening portion so that a central portion of the transmissive-window forming composition has a convex shape in an upward direction.

The transmissive-window forming composition may be disposed in the second opening portion by using a nozzle printing method or an inkjet printing method.

The method may further include, between the disposing of the transmissive-window forming composition and the forming of the barrier rib, volatilizing the second solvent.

The laminating may be performed by adhering the metal layer formed on the barrier rib to the laminating film.

The liquefying of the transmissive-window forming composition may be performed by heating the first solvent to a temperature of about 30 to about 80° C.

The panel may include a thin film transistor (TFT) formed on the first substrate, a passivation layer formed to cover the TFT, a pixel electrode formed on the passivation layer and connected to the TFT, and a pixel definition layer formed on the passivation layer, the pixel definition layer including the first opening portion for exposing the pixel electrode therethrough, and the second opening spaced apart from the first opening portion.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
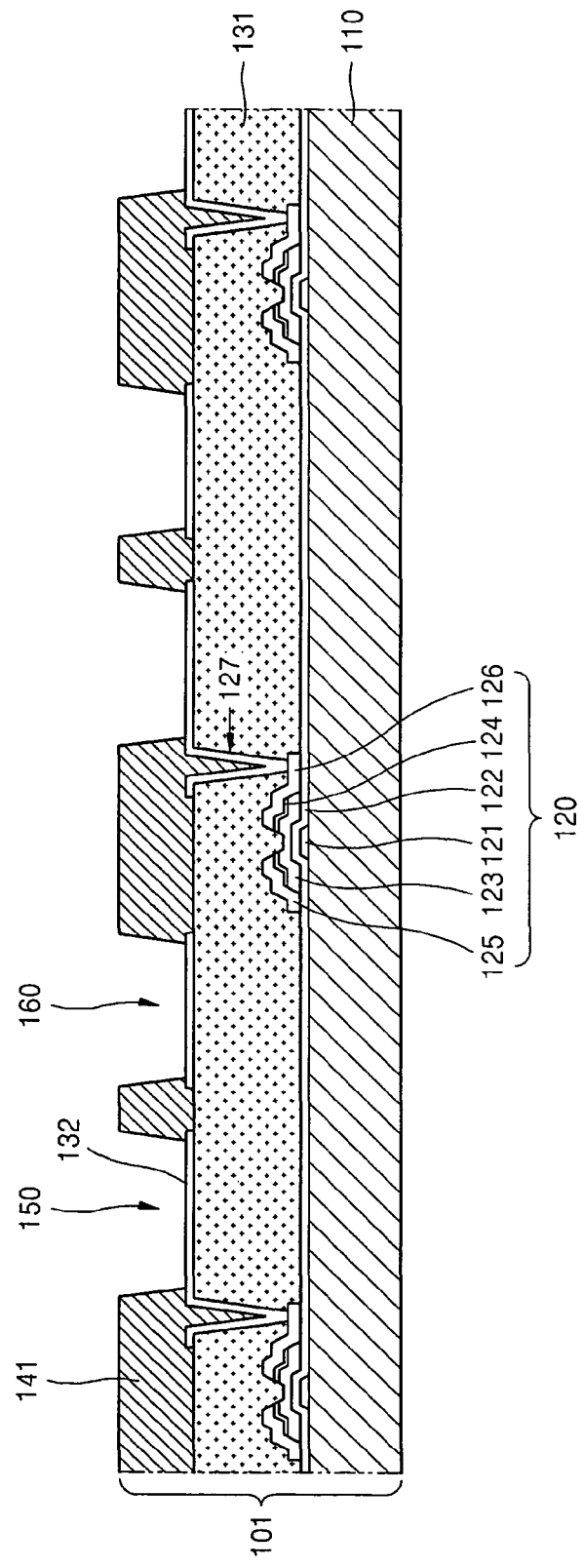
FIGS. 1 through 8 illustrate cross-sectional views of stages in a method of manufacturing an organic light emitting display device according to a first example embodiment.

Korean Patent Application No. 10-2010-0017196, filed on Feb. 25, 2010, in the Korean Intellectual Property Office, and entitled: "Method of Manufacturing Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1 through 8 illustrate cross-sectional views of stages in a method of manufacturing an organic light emitting display device according to a first example embodiment.

In the first example embodiment, referring to FIG. 1, a panel 101 may be provided with a first opening portion 150 and a second opening portion 160 on a first substrate 110.

The panel 101 may include a thin film transistor (TFT) 120 formed on the first substrate 110, a passivation layer 131 formed to cover the TFT 120, and a pixel definition layer 141 formed on the passivation layer 131, the pixel definition layer 141 including the first opening portion 150 and the second opening portion 160 through which a pixel electrode 132 is exposed. The manufacture of the organic light emitting display device may be completed by sealing the panel 101 with a sealing member (not shown).

In FIG. 1, the TFT 120 is formed of amorphous silicon. Alternatively, the TFT 120 may be formed of, e.g., polysilicon.

The method of manufacturing the organic light emitting display device according to the present example embodiment will now be described.

The first substrate 110, which may be formed of an insulating material such as glass, quartz or plastic, may have a gate electrode 121 formed thereon.

A gate insulating layer 122, which may be formed of silicon nitride ($SiN_x$) or the like, may be formed on the first substrate 110 and on the gate electrode 121. A semiconductor layer 123, which may be formed of amorphous silicon, and a resistive contact layer 124, which may be formed of n+ hydride amorphous silicon that is highly doped with n-type impurities, may be disposed sequentially on the gate insulating layer 122 below which the gate electrode 121 is disposed. The resistive contact layer 124 may be divided into two parts with respect to the gate electrode 121, as shown in FIG. 1.

A source electrode 125 and a drain electrode 126 may be formed on the resistive contact layer 124 and on the gate insulating layer 122. The source electrode 125 and the drain electrode 126 may be separated from each other with respect to the gate electrode 121.

The passivation layer 131 may be formed on the source electrode 125, on the drain electrode 126, and on a portion of the semiconductor layer 123 on which the source electrode 125 and the drain electrode 126 are not formed. The passivation layer 131 may be formed of, e.g., silicon nitride ($SiN_x$)

and/or an organic material. A contact hole 127 for exposing the drain electrode 126 therethrough may be formed in the passivation layer 131.

The pixel electrode 132 may be formed on the passivation layer 131. The pixel electrode 132 may be an anode or a cathode. The pixel electrode 132 may be formed of, e.g., a transparent conductive material such as indium tin oxide (ITO) or indium zinc oxide (IZO), and may be formed using a sputtering method.

The pixel definition layer 141 may be formed on the passivation layer 131. The pixel definition layer 141 may include the first opening portion 150 for exposing the pixel electrode 132 therethrough. The first opening portion 150 may be formed on the TFT 120 and the contact hole 127 so as to divide pixel electrodes 132 and define pixel regions. The pixel definition layer 141 may prevent short circuits from occurring between the source electrode 125 and the drain electrode 126 of the TFT 120, and a metal layer 152 (see FIG. 4) as a common electrode. The pixel definition layer 141 may be formed of, e.g., a photosensitive material having excellent solvent resistance, such as an acrylic resin, a polyimide resin, or the like, or an inorganic material such as $SiO_2$, $TiO_2$, and may be formed in a two-layer structure including an organic layer and an inorganic layer.

The pixel definition layer 141 may include the second opening portion 160 that is disposed spaced apart from the first opening portion 150. As described in detail below, a transmissive-window forming composition 171 may be disposed in the second opening portion 160 (see FIG. 2). The transmissive-window forming composition 171 may be used in the formation of a transmissive window 161 (see FIG. 7) by opening the metal layer 152 (see FIG. 4) formed on the second opening portion 160.

Figure 2:
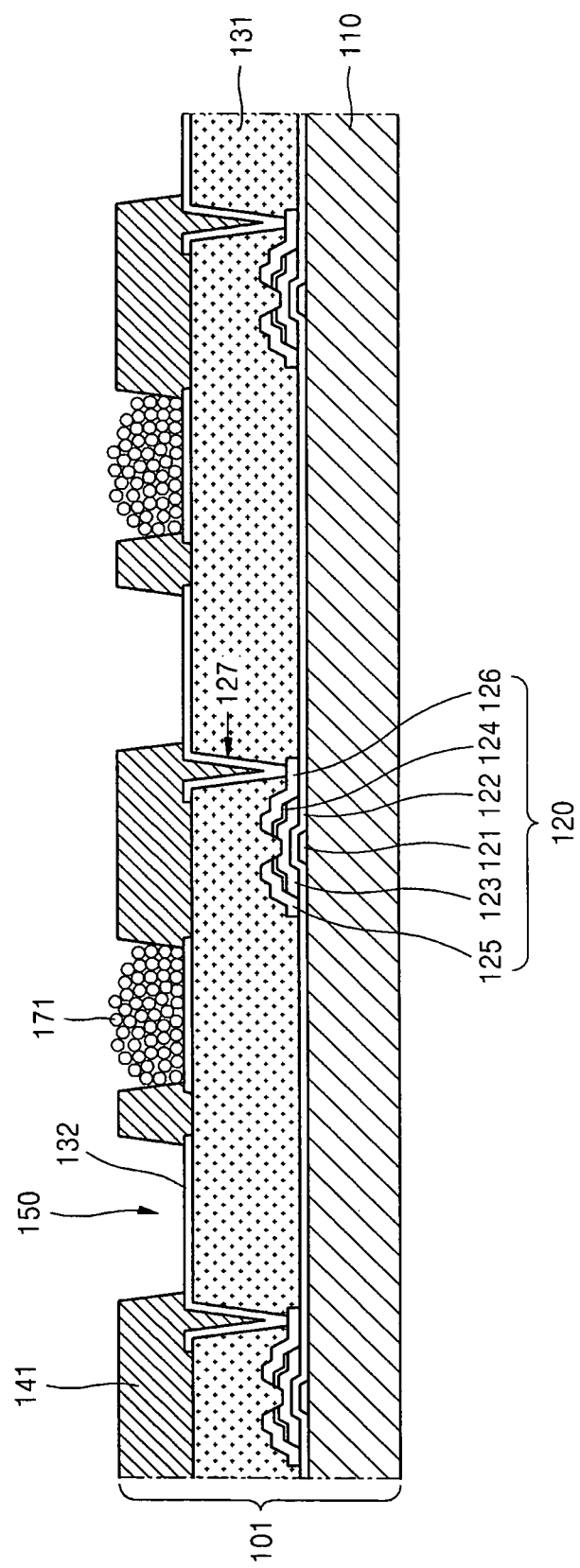

In FIG. 2, the transmissive-window forming composition 171 is disposed in the second opening portion 160. A transmissive window may be formed by volatilizing the transmissive-window forming composition to open a region of the metal layer 152 corresponding to the second opening portion 160.

The transmissive-window forming composition may prevent adhesion of the metal layer 152 in the second opening portion 160. For example, the transmissive-window forming composition may serve as an easily-applied sacrificial material that supports and spaces the metal layer 152 from the underlying layer, e.g., pixel electrode 132, and that separates, e.g., splits or bursts, the metal layer 152 at a predetermined time in the fabrication process. The transmissive-window forming composition may be used to generate an expansive force in the second opening portion 160 as sealed by the metal layer 152, the expansive force being sufficient to open the region of the metal layer 152 corresponding to the second opening portion 160.

In an implementation, the transmissive-window forming composition 171 may be added dropwise onto the second opening portion 160 by using, e.g., a nozzle printing method or an inkjet printing method. The transmissive-window forming composition 171 may be disposed in the second opening portion 160 so that a central portion of the transmissive-window forming composition 171 may have a convex shape in an upward direction, i.e., a hump.

In an example embodiment, the transmissive-window forming composition 171 includes a first solvent and a second solvent, where, at a deposition temperature, e.g., room temperature, the first solvent is in a solid state and the second solvent is in a liquid state, and the mixture of the first solvent and the second solvent is a liquid suitable for deposition, e.g., by a printing method. For example, the second solvent may be selected to have a high boiling point, e.g., about 100 to about 200° C., suitable for bursting the metal layer 152 by volatilization while avoiding volatilization during preceding process operations, and the first solvent may be selected to dissolve the second solvent and yield a liquid suitable for printing at the desired operating temperature, e.g., about 10 to about 30° C.

In an implementation, the transmissive-window forming composition 171 may include a first solvent that is in a solid state at a temperature of about 10 to about 30° C., and a second solvent that is in a liquid state at a temperature of about 10 to about 30° C. In an implementation, the first solvent may be in the solid state throughout a range of 10 to 30° C. In an implementation, the second solvent may be in the liquid state throughout the range of 10 to 30° C. Generally, an inkjet printing method is performed at about room temperature, e.g., at a temperature of about 10 to about 30° C. When the first solvent is neat, the first solvent may be in a solid state at the deposition temperature, e.g., at a temperature of about 10 to about 30° C. when a printing method is used. However, since the second solvent is in a liquid state at a temperature of about 10 to about 30° C., the first solvent in a solid state may be dissolved in the second solvent.

Hereinafter, examples of the first solvent and the second solvent will be described in detail.

The melting point of the first solvent may be higher than room temperature. The melting point of the first solvent may be about 30 to about 200° C. If the melting point of the first solvent is lower than about 30° C., the first solvent may be liquefied during the manufacturing processes. If the melting point of the first solvent is higher than about 200° C., excessive heating may be required to liquefy the first solvent.

The boiling point of the first solvent may be about 200° C. or higher. The boiling point of the first solvent may be about 200 to about 500° C. If the boiling point of the first solvent is lower than about 200° C., the first solvent may be excessively volatilized during the manufacturing processes. If the boiling point of the first solvent is higher than about 500° C., excessive heating may be required to volatilize the first solvent.

The boiling point of the second solvent may be about 100° C. or higher. The boiling point of the second solvent may be about 100 to about 200° C. If the boiling point of the second solvent is lower than about 100° C., the second solvent may be excessively volatilized during the manufacturing processes.

The amount of the first solvent in the transmissive-window forming composition may be about 10 to about 150 parts by weight based on 100 parts by weight of the second solvent. If the amount of the first solvent is greater than about 150 parts by weight based on 100 parts by weight of the second solvent, the first solvent may be precipitated in a solid state, which may damage an inkjet nozzle. In an implementation, the amount of the first solvent in the transmissive-window forming composition may be about 20 to about 40 parts by weight based on 100 parts of weight of the second solvent.

The first solvent may be, e.g., an aromatic-based compound, such as bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, decafluorobiphenyl, 1,4-di-tert-butylbenzene, 2,6-di-tert-butyl-4-ethylphenol, 2,6-di-tert-butylphenol, 2,4-di-tert-butylphenol, 2,5-dichloroaniline, or 3,5-dichlorocatechol.

The second solvent may be, e.g., a $C_1$-$C_{12}$ aliphatic compound or a $C_6$-$C_{20}$ aromatic compound. Examples of the $C_1$-$C_{12}$ aliphatic compound may include tetrahydrofuran, chloroform, N,N-dimethylformamide, 4-methylheptane, 1,4- dioxane, 1-propanol, cyclohexanone, decane, propylene carbonate, and nonane. Examples of the $C_6$-$C_{20}$ aromatic compound may include 4-methyl anisole, toluene, tetralin, diphenylether, 1,3-dichlorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

Figure 3:
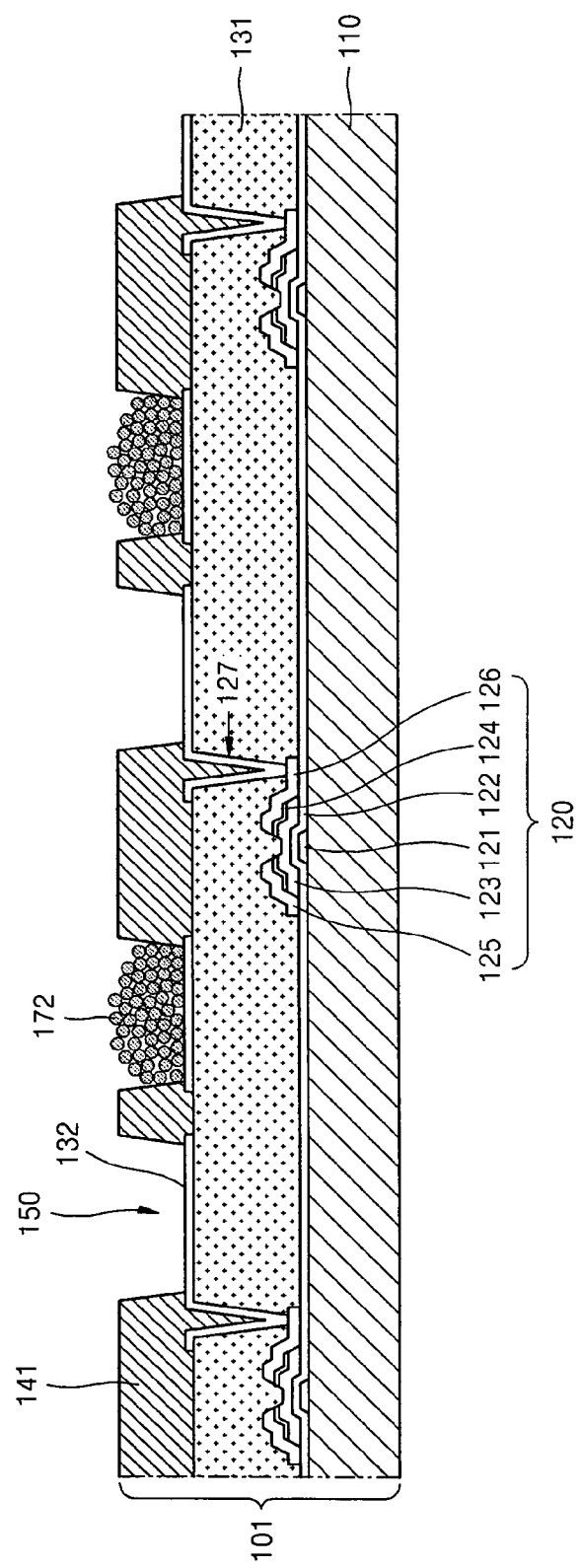

Referring to FIGS. 2 and 3, the transmissive-window forming composition 171 may be disposed in the second opening portion 160, and then the second solvent of the transmissive-window forming composition 171 is volatilized. Thus, after the second solvent is volatilized, only the first solvent in a solid state remains in a transmissive-window forming composition 172. It will be appreciated that, depending on the solvent system, removal of all of the second solvent may not be required to provide the first solvent in a solid state. In an implementation, the second solvent may be removed to an extent sufficient to provide the first solvent+residual second solvent in a solid state and with a boiling point satisfying the manufacturing requirements with respect to melting point and boiling point.

Figure 4:
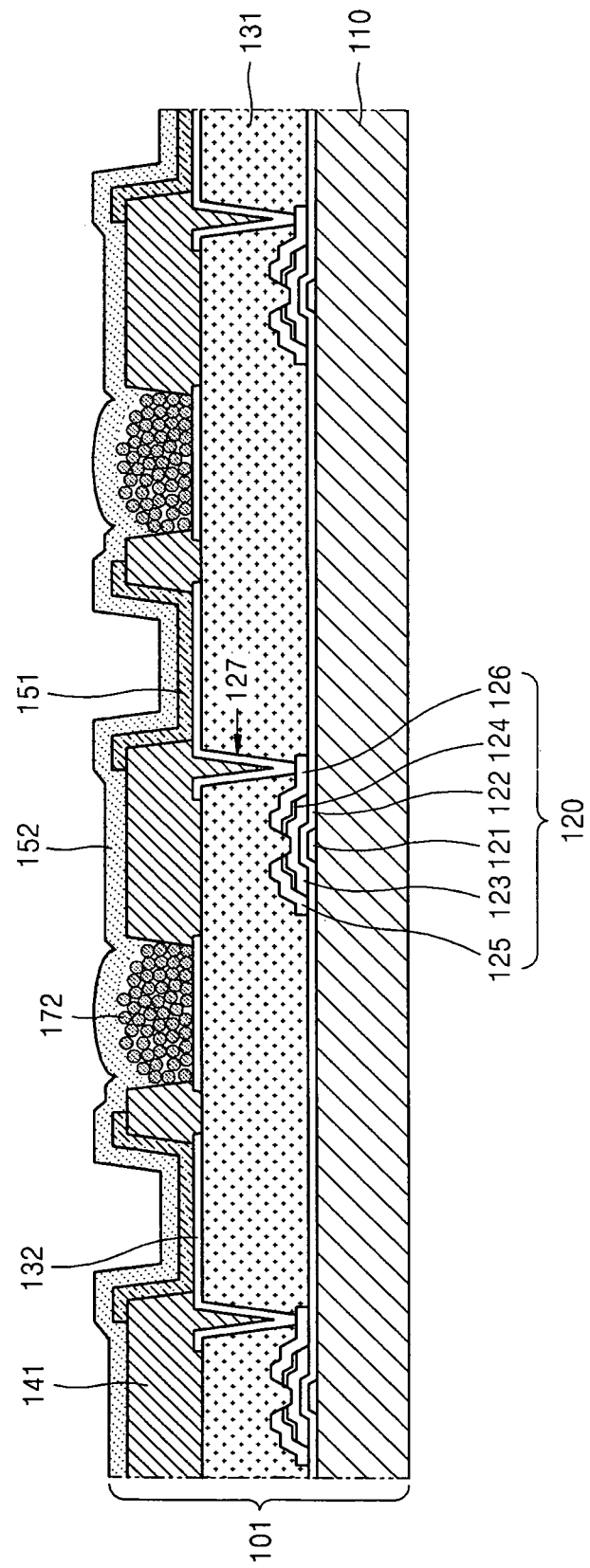
Figure 5:
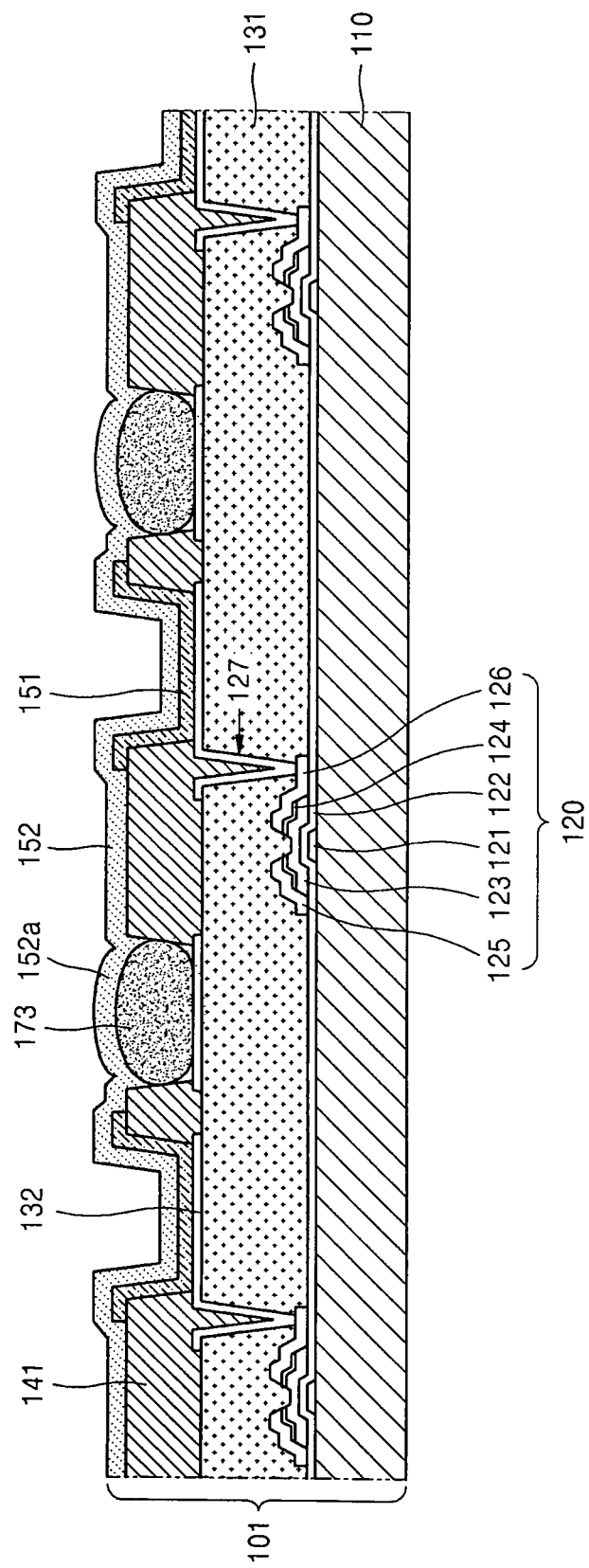

Then, referring to FIG. 4, an organic layer 151 may be formed on the pixel electrode 132 of the first opening portion 150, and the metal layer 152 may be formed on the pixel definition layer 141 so as to cover the organic layer 151 and the transmissive-window forming composition 172.

The organic layer 151 may be formed of, e.g., a small molecular weight organic material or a high molecular weight organic material. The organic layer 151 may include an organic material providing an electroluminescent function. When the organic layer 151 is formed of a small molecular weight organic material, the organic layer 151 may be formed by stacking a hole injection layer (HIL), a hole transport layer (HTL), an emission layer (EML), an electron transport layer (ETL), and an electron injection layer (EIL) in a single or composite structure. An organic material used for forming the organic layer 151 may be copper phthalocyanine (CuPc), N,N'-di(naphthalene-1-yl)-N,N'-diphenyl-benzidine (NPB), tris-8-hydroxyquinoline aluminum (Alq3), or the like. The organic layer 151 formed of a small molecular weight organic material may be formed using a vacuum deposition method.

When the organic layer 151 is formed of high molecular weight organic material, the organic layer 151 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 151 is not limited to the organic layers described above, and may be embodied in various ways.

The metal layer 152 may be formed on the pixel definition layer 141 so as to cover the organic layer 151 and the transmissive-window forming composition 172. The metal layer 152 may be formed using, e.g., a sputtering method. The metal layer 152 may function as a common electrode. When the pixel electrode 132 functions as an anode, the metal layer 152 functions as a cathode. When the pixel electrode 132 functions as a cathode, the metal layer 152 functions as an anode.

Then, the transmissive window 161 may be formed by volatilizing a transmissive-window forming composition 173 to open a metal layer region 152a corresponding to the second opening portion 160. In more detail, referring to FIG. 5, the transmissive-window forming composition 173 is heated to be liquefied. In an implementation, only the first solvent remains in the transmissive-window forming composition 173 in a solid state, the second solvent having been volatilized in the previous operation. In the current operation, the transmissive-window forming composition 173 including the first solvent in a solid state is heated to be liquefied. The transmissive-window forming composition 173 may be heated by heating the panel 101. The first solvent may be heated, e.g., to a temperature of about 30 to about 80° C., in order to liquefy the transmissive-window forming composition 173 including the first solvent in a solid state.

Figure 6:
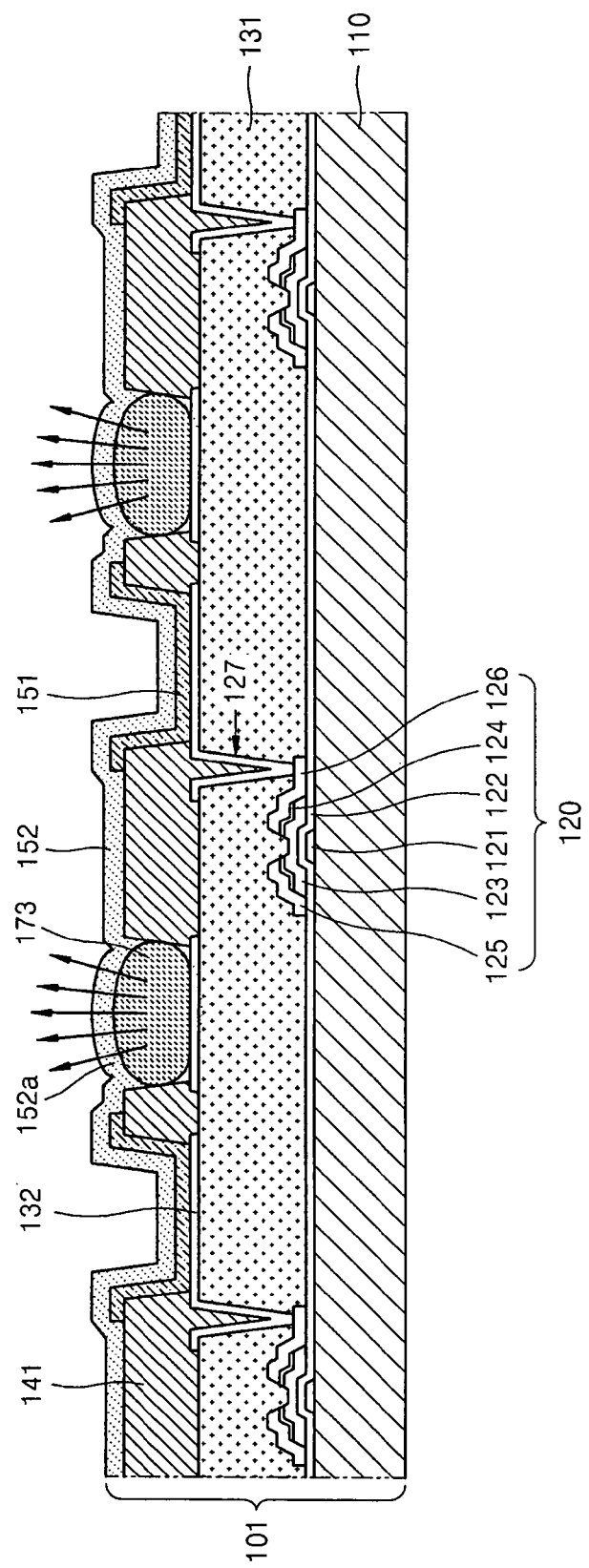

Then, referring to FIG. 6, the transmissive-window forming composition 173 including the liquefied first solvent may be vaporized. The first solvent may be heated, e.g., to a temperature of about 80 to about 200° C., in order to vaporize the transmissive-window forming composition 173. The first solvent may be vaporized at a temperature, e.g., of about 80 to about 200° C., at which the organic layer 151 does not deteriorate.

Figure 7:
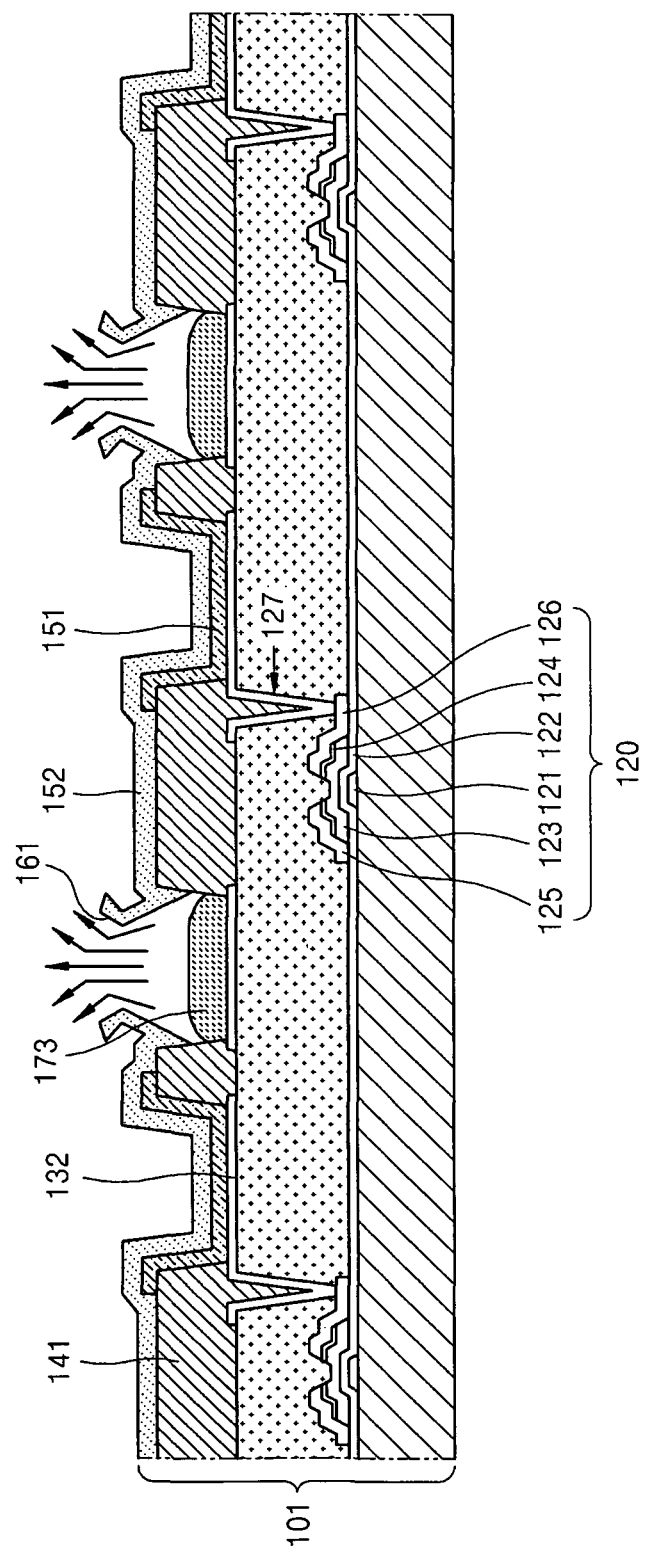

The transmissive-window forming composition 173 may be surrounded, e.g., contained, by the second opening portion 160 and the metal layer region 152a. Thus, when the first solvent is vaporized, internal pressure of the second opening portion 160 may be increased and the second opening portion 160 (see FIG. 1) may be opened due to a continuous increase of the internal pressure. Bursting the metal layer region 152a corresponding to the second opening portion 160 may thus form the transmissive window 161, as shown in FIG. 7. As such, according to the present embodiment, the transmissive window 161 may be formed without using a fine metal mask (FMM).

Figure 8:
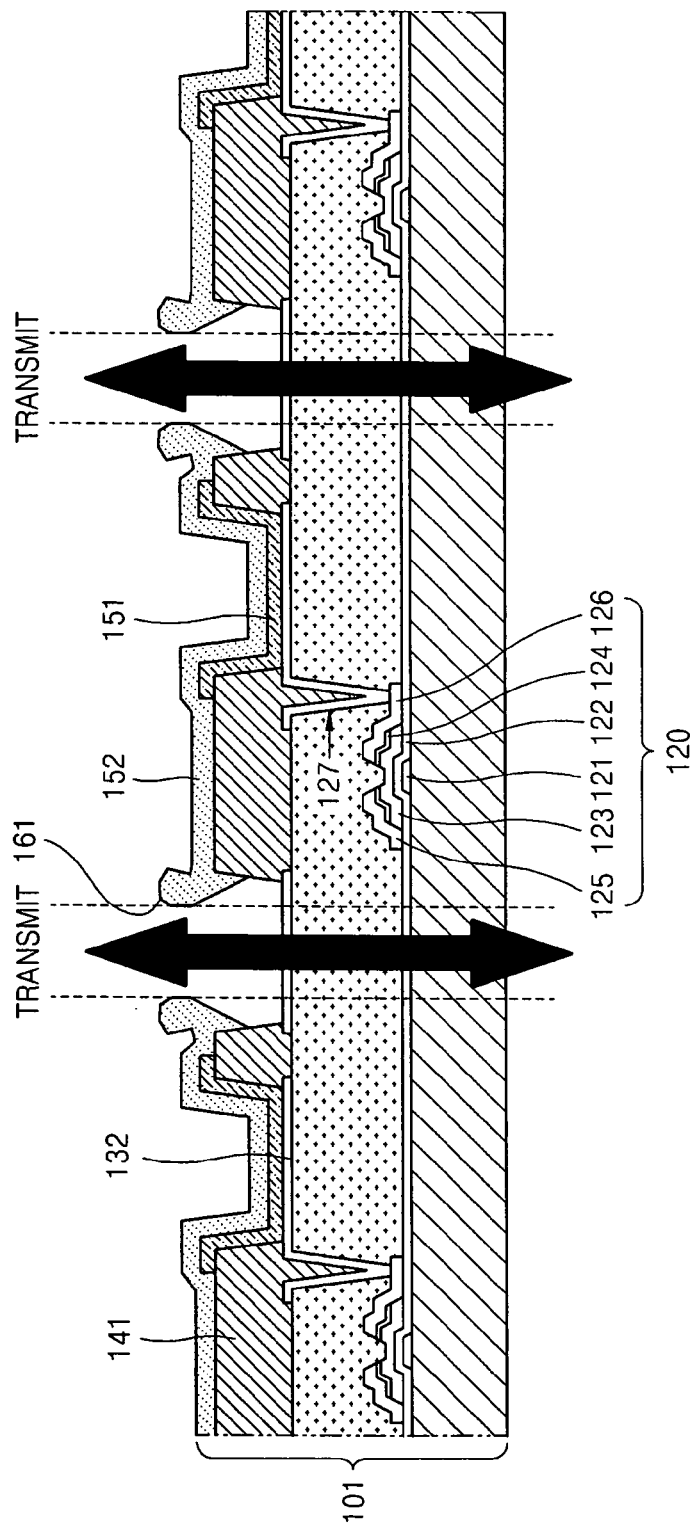

After the metal layer region 152a is opened by vaporizing the first solvent, the panel 100 may be heated until all of the first solvent remaining in the second opening portion 160 is vaporized. Referring to FIG. 8, since external light may be transmitted through the transmissive window 161, a transparent organic light emitting display device may be formed with one or more such transmissive windows 161.

FIGS. 9 through 14 illustrate cross-sectional views of stages in a method of manufacturing an organic light emitting display device according to a second example embodiment.

Figure 9:
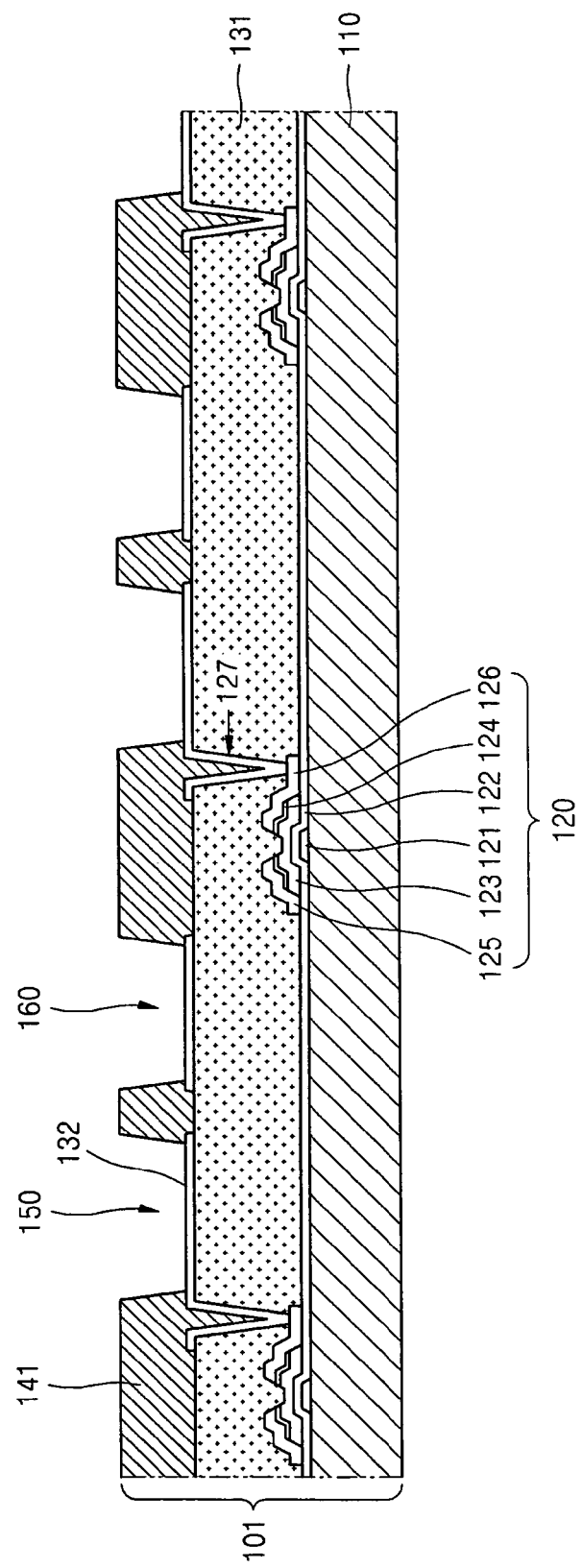
FIGS. 9 through 14 illustrate cross-sectional views of stages in a method of manufacturing an organic light emitting display device according to a second example embodiment.

In the second example embodiment, referring to FIG. 9, the panel 101 may be provided with the first opening portion 150 and the second opening portion 160 on the first substrate 110.

The panel 101 may include the TFT 120 formed on the first substrate 110, the passivation layer 131 formed to cover the TFT 120, and the pixel definition layer 141 formed on the passivation layer 131, the pixel definition layer 141 including the first opening portion 150 and the second opening portion 160 through which the pixel electrode 132 is exposed. The manufacture of the organic light emitting display device may be completed by sealing the panel 101 with a sealing member (not shown). Various elements of the panel 101 in FIG. 9 have already been described above in connection with the first embodiment.

Figure 10:
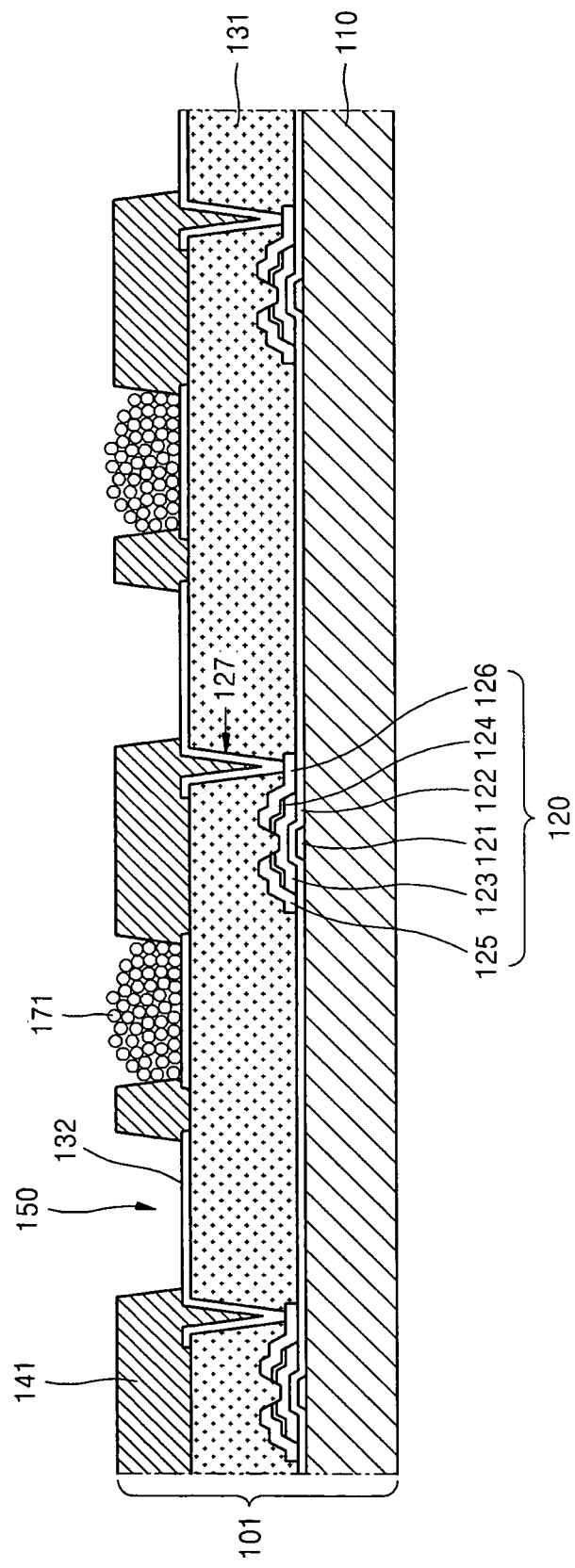

Next, in FIG. 10, the transmissive-window forming composition 171 may be disposed in the second opening portion 160. The transmissive-window forming composition 171 may be added dropwise onto the second opening portion 160 by using, e.g., a nozzle printing method or an inkjet printing method. The transmissive-window forming composition 171 may be disposed in the second opening portion 160 so that a central portion of the transmissive-window forming composition 171 may have a convex shape in an upward direction.

In an example embodiment, the transmissive-window forming composition 171 includes a first solvent and a second solvent, where, at room temperature, the first solvent is in a solid state and the second solvent is in a liquid state. In an implementation, the transmissive-window forming composition 171 may include a first solvent that is in a solid state at a temperature of about 10 to about 30° C., and a second solvent that is in a liquid state at a temperature of about 10 to about 30° C. Generally, an inkjet printing method is performed at about room temperature, that is, at a temperature of about 10 to about 30° C. When the first solvent is neat, the first solvent may be in a solid state at the deposition temperature, e.g., at a temperature of about 10 to about 30° C. when a printing method is used. However, the second solvent may be in a liquid state at a temperature of about 10 to about 30° C., and the first solvent in a solid state may be dissolved in the second solvent. The first solvent and the second solvent have been described above in connection with the first embodiment.

Figure 11:
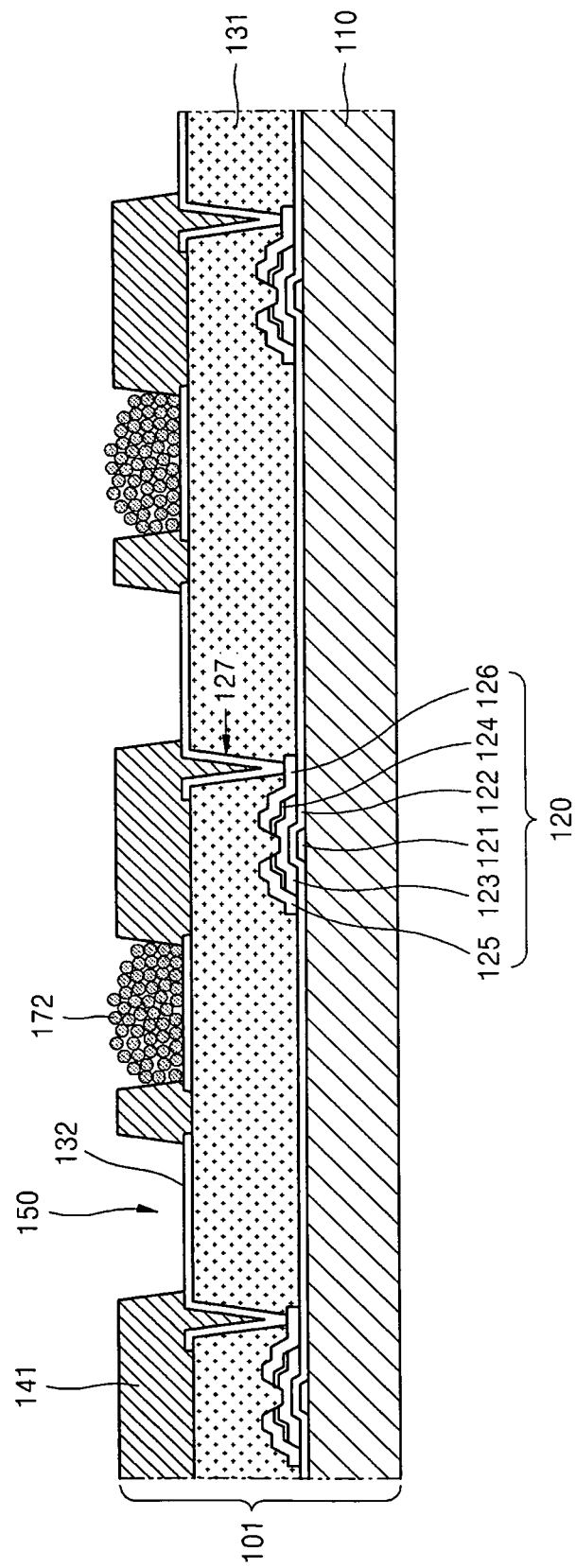

Then, referring to FIGS. 10 and 11, after the transmissive-window forming composition 171 is disposed in the second opening portion 160, the second solvent of the transmissive-window forming composition 171 may be volatilized. After the second solvent is volatilized, only the first solvent in a solid state may remain in the transmissive-window forming composition 172. It will be appreciated that, depending on the solvent system, removal of all of the second solvent may not be required to provide the first solvent in a solid state. The second solvent may be removed to an extent sufficient to provide the remaining first solvent and any second solvent in a solid state, and with a boiling point satisfying the manufacturing requirements with respect to melting point and boiling point.

Figure 12:
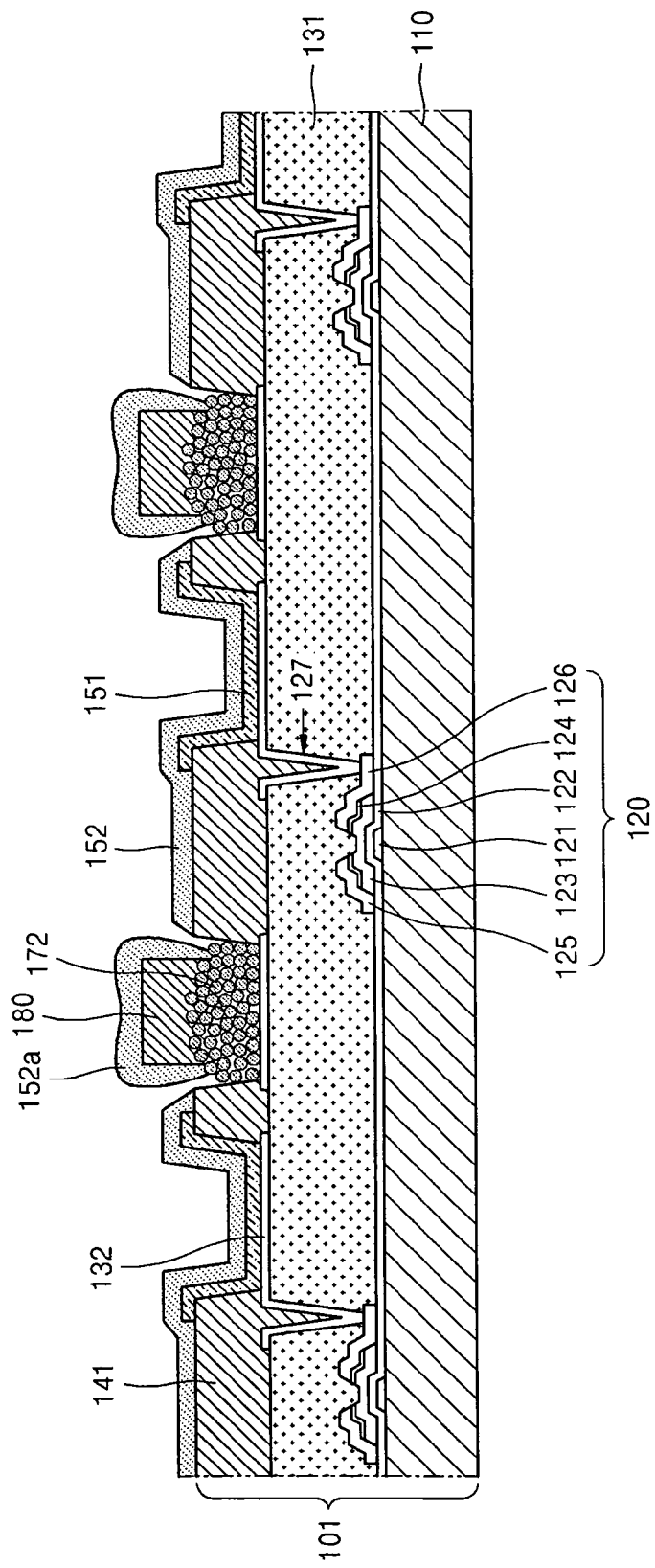

Then, referring to FIG. 12, a barrier rib 180 may be disposed on the transmissive-window forming composition 172. The organic layer 151 may be formed on the pixel electrode 132 of the first opening portion 150.

The barrier rib 180 may be disposed to be formed on the transmissive-window forming composition 172 so as not to overlap the pixel definition layer 141 formed around the transmissive-window forming composition 172. The barrier rib 180 may be formed so to be higher than the pixel definition layer 141. Thus, a total height of the transmissive-window forming composition 172 and the barrier rib 180 may be greater than a height of the pixel definition layer 141.

After the organic layer 151 is formed, the metal layer 152 may be formed on the pixel definition layer 141 so as to cover the organic layer 151 and the barrier rib 180. The metal layer 152 may function as a common electrode, as described above.

Figure 13:
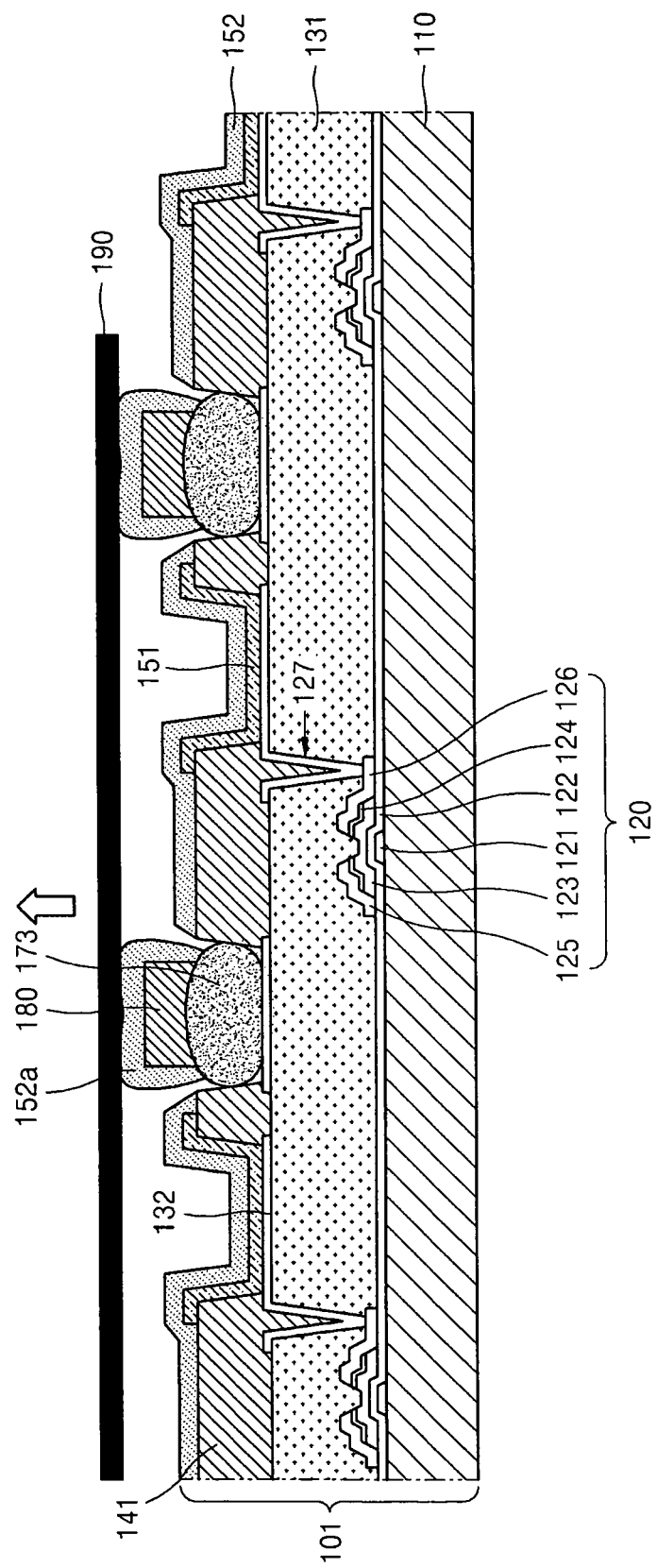

Then, referring to FIG. 13, a lamination film 190 may be laminated on the panel 101. As described above, the barrier rib 180 may be disposed on the transmissive-window forming composition 172 so as to be higher than the pixel definition layer 141. Thus, the lamination film 190 may be laminated to the metal layer region 152a formed on the barrier rib 180.

After the lamination film 190 is laminated on the panel 101, the transmissive-window forming composition 173 (including the first solvent in a solid state) may be liquefied. For example, the first solvent may be heated to a temperature of about 30 to about 80° C. in order to liquefy the first solvent from the solid state. The panel 101 may be heated in order to heat the first solvent.

Figure 14:
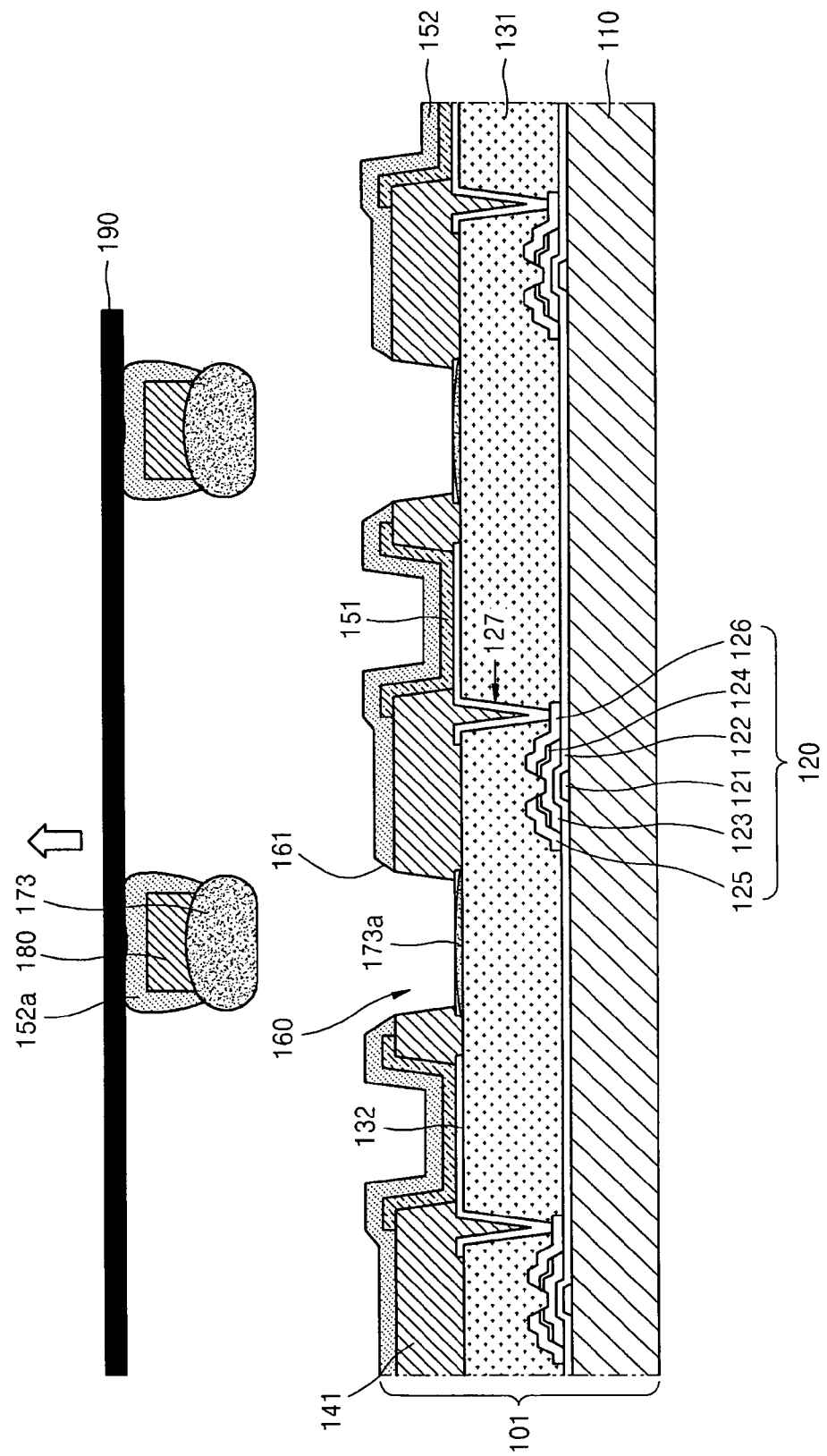

Then, referring to FIG. 14, de-lamination may be performed on the lamination film 190. In the previously-described operation, the lamination film 190 was laminated on the panel 101, and the first solvent was liquefied. Thus, when the lamination film 190 is delaminated, the metal layer 152a, the barrier rib 180, and the first solvent may be delaminated by the lamination film 190, as shown in FIG. 14, thereby forming the transmissive window 161.

With the first solvent is in a liquid state, after the first solvent is delaminated, the first solvent may remain in the second opening portion 160. In this case, some first solvent may be heated in order to vaporize the first solvent and remove any remaining first solvent from the second opening portion 160.

As described above, embodiment relate to an organic light emitting display device and a method of manufacturing an organic light emitting display device. In an embodiment, a transparent organic light emitting display device may be fabricated. The fabrication process may includes patterning a metal layer using a transmissive-window forming composition, thus avoiding the need to use a FMM to pattern the metal layer. Thus, a process using the FMM may be omitted, and manufacturing costs of the organic light emitting display device may be reduced accordingly.

When a transparent display device is switched-off, an image of an object positioned opposite to the transparent display device is transmitted through patterns of TFTs, various wirings, and spaces therebetween, as well as through an organic light emitting element, to reach a user. Thus, although the transparent display device is transparent, if the transmittance of the organic light emitting element, the TFT, or the wirings is not high, and/or spaces therebetween are very small, then the total transmittance of the transparent display device may not be high. In such a case, a user may receive an image that is distorted by the patterns of the organic light emitting element, the TFT, and the wirings, e.g., if gaps between the patterns are only a few nanometers, i.e., at a level close to the wavelengths of visible light, such that the gaps scatter light as it passes therethrough. According to the embodiments described herein, however, an organic light emitting display device may be formed as a transparent display with one or more transmissive windows therein for transmitting visible light, which may help reduce or eliminate distortions in the image viewed through the display.

Example embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing an organic light emitting display device, the method comprising:
    providing a panel including a first opening portion formed in a first substrate and a second opening portion spaced apart from the first opening portion;
    disposing a transmissive-window forming composition in the second opening portion;
    forming an organic layer in the first opening portion;
    forming a metal layer on the panel so as to cover the first opening portion and the second opening portion; and
    forming a transmissive window by volatilizing the transmissive-window forming composition to open a region of the metal layer corresponding to the second opening portion.

2. The method as claimed in claim 1, wherein the transmissive-window forming composition includes a first solvent that is in a solid state at a temperature of about 10 to about 30° C., and a second solvent that is in a liquid state at a temperature of about 10 to about 30° C.

3. The method as claimed in claim 2, wherein a melting point of the first solvent is about 30 to about 200° C.

4. The method as claimed in claim 2, wherein a boiling point of the first solvent is about 200 to about 500° C.

5. The method as claimed in claim 2, wherein a boiling point of the second solvent is about 100 to about 200° C.

6. The method as claimed in claim 2, wherein an amount of the first solvent in the transmissive-window forming composition is about 10 to about 150 parts by weight based on 100 parts by weight of the second solvent.

7. The method as claimed in claim 2, wherein an amount of the first solvent in the transmissive-window forming composition is about 20 to about 40 parts by weight based on 100 parts by weight of the second solvent.

8. The method as claimed in claim 2, wherein the first solvent includes at least one of bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, decafluorobiphenyl, 1,4-di-tert-butylbenzene, 2,6-di-tert-butyl-4-ethylphenol, 2,6-di-tert-butylphenol, 2,4-di-tert-butylphenol, 2,5-dichloroaniline, and 3,5-dichlorocatechol.

9. The method as claimed in claim 2, wherein the second solvent includes at least one of tetrahydrofuran, chloroform, N,N-dimethylformamide, 4-methylheptane, 1,4-dioxane, 1-propanol, cyclohexanone, decane, propylene carbonate, nonane, 4-methyl anisole, toluene, tetralin, diphenylether, 1,3-dichlorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

10. The method as claimed in claim 1, wherein the transmissive-window forming composition is disposed in the second opening portion so that a central portion of the transmissive-window forming composition has a convex shape in an upward direction.

11. The method as claimed in claim 1, wherein the transmissive-window forming composition is disposed in the second opening portion by using a nozzle printing method or an inkjet printing method.

12. The method as claimed in claim 1, further comprising, between the disposing of the transmissive-window forming composition and the forming of the metal layer, volatilizing the second solvent.

13. The method as claimed in claim 2, wherein the forming of the transmissive window includes:
    liquefying the first solvent by heating the first solvent;
    vaporizing the first solvent from a liquid state;
    forming the transmissive window by increasing a vapor pressure of the first solvent vaporized in the second opening to open a region of the metal layer, corresponding to the second opening portion; and
    emitting the first solvent to outside through opened region of the metal layer.

14. The method as claimed in claim 13, wherein the liquefying of the first solvent is performed by heating the first solvent to a temperature of about 30 to about 80° C.

15. The method as claimed in claim 13, wherein the vaporizing of the first solvent is performed by heating the first solvent to a temperature of about 80 to about 200° C.

16. The method as claimed in claim 13, wherein the emitting of the first solvent includes heating the panel while the first solvent is removed from the second opening portion.

17. The method as claimed in claim 1, wherein the panel includes:
    a thin film transistor (TFT) formed on the first substrate;
    a passivation layer formed to cover the TFT;
    a pixel electrode formed on the passivation layer and connected to the TFT; and
    a pixel definition layer formed on the passivation layer, the pixel definition layer including:
    the first opening portion for exposing the pixel electrode therethrough, and
    the second opening spaced apart from the first opening portion.

18. A method of manufacturing an organic light emitting display device, the method comprising:
    providing a panel including a first opening portion formed in a first substrate and a second opening portion spaced apart from the first opening portion;
    disposing a transmissive-window forming composition in the second opening portion;
    disposing a barrier rib on the transmissive-window forming composition;
    forming an organic layer in the first opening portion;
    forming a metal layer on the panel so as to cover the organic layer and the barrier rib;
    laminating a laminating film on the metal layer;
    liquefying the transmissive-window forming composition; and
    removing the barrier rib and the transmissive-window forming composition from the second opening portion by delaminating the lamination film.

19. The method as claimed in claim 18, wherein the transmissive-window forming composition includes a first solvent that is in a solid state at a temperature of about 10 to about 30° C., and a second solvent that is in a liquid state at a temperature of about 10 to about 30° C.

20. The method as claimed in claim 19, wherein a melting point of the first solvent is about 30 to about 200° C.

21. The method as claimed in claim 19, wherein a boiling point of the first solvent is about 200 to about 500° C.

22. The method as claimed in claim 19, wherein a boiling point of the second solvent is about 100 to about 200° C.

23. The method as claimed in claim 19, wherein an amount of the first solvent in the transmissive-window forming composition is about 10 to about 150 parts by weight based on 100 parts by weight of the second solvent.

24. The method as claimed in claim 19, wherein an amount of the first solvent in the transmissive-window forming composition is about 20 to about 40 parts by weight based on 100 parts by weight of the second solvent.

25. The method as claimed in claim 19, wherein the first solvent includes at least one of bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, decafluorobiphenyl, 1,4-di-tert-butylbenzene, 2,6-di-tert-butyl-4-ethylphenol, 2,6-di-tert-butylphenol, 2,4-di-tert-butylphenol, 2,5-dichloroaniline, and 3,5-dichlorocatechol.

26. The method as claimed in claim 19, wherein the second solvent includes at least one of tetrahydrofuran, chloroform, N,N-dimethylformamide, 4-methylheptane, 1,4-dioxane, 1-propanol, cyclohexanone, decane, propylene carbonate, nonane, 4-methyl anisole, toluene, tetralin, diphenylether, 1,3-dichlorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

27. The method as claimed in claim 18, wherein the transmissive-window forming composition is disposed in the second opening portion so that a central portion of the transmissive-window forming composition has a convex shape in an upward direction.

28. The method as claimed in claim 18, wherein the transmissive-window forming composition is disposed in the second opening portion by using a nozzle printing method or an inkjet printing method.

29. The method as claimed in claim 18, further comprising, between the disposing of the transmissive-window forming composition and the forming of the barrier rib, volatilizing the second solvent.

30. The method as claimed in claim 18, wherein the laminating is performed by adhering the metal layer formed on the barrier rib to the laminating film.

31. The method as claimed in claim 19, wherein the liquefying of the transmissive-window forming composition is performed by heating the first solvent to a temperature of about 30 to about 80° C.

32. The method as claimed in claim 18, wherein the panel includes:
- a thin film transistor (TFT) formed on the first substrate;
- a passivation layer formed to cover the TFT;
- a pixel electrode formed on the passivation layer and connected to the TFT; and
- a pixel definition layer formed on the passivation layer, the pixel definition layer including:
- the first opening portion for exposing the pixel electrode therethrough, and
- the second opening spaced apart from the first opening portion.

* * * * *